(12) United States Patent
Yoo et al.

(10) Patent No.: US 9,324,973 B2
(45) Date of Patent: Apr. 26, 2016

(54) APPARATUS FOR FORMING ORGANIC LIGHT EMITTING LAYER AND METHOD OF FORMING ORGANIC LIGHT EMITTING LAYER USING THE SAME

(71) Applicant: Samsung Display Co., Ltd., Yongin, Gyeonggi-Do (KR)

(72) Inventors: Hee-Soo Yoo, Yongin (KR); Mu Gyeom Kim, Yongin (KR)

(*) Notice: Subject to any disclaimer, the term of this patent is extended or adjusted under 35 U.S.C. 154(b) by 133 days.

(21) Appl. No.: 13/962,872

(22) Filed: Aug. 8, 2013

(65) Prior Publication Data
US 2014/0315336 A1 Oct. 23, 2014

(30) Foreign Application Priority Data
Apr. 17, 2013 (KR) .................. 10-2013-0042373

(51) Int. Cl.
| | | |
|---|---|---|
| H01L 51/56 | (2006.01) | |
| B05C 21/00 | (2006.01) | |
| C23C 14/04 | (2006.01) | |
| C23C 16/04 | (2006.01) | |
| H01L 51/00 | (2006.01) | |
| H01L 27/32 | (2006.01) | |

(52) U.S. Cl.
CPC .............. *H01L 51/56* (2013.01); *B05C 21/005* (2013.01); *C23C 14/042* (2013.01); *C23C 16/042* (2013.01); *H01L 51/0005* (2013.01); *H01L 27/3211* (2013.01); *H01L 27/3246* (2013.01)

(58) Field of Classification Search
USPC ........................................ 118/504, 505, 620
See application file for complete search history.

(56) References Cited

U.S. PATENT DOCUMENTS

| | | | |
|---|---|---|---|
| 2004/0265622 A1* | 12/2004 | Sadasivan et al. | ............ 428/690 |
| 2006/0092218 A1 | 5/2006 | White et al. | |
| 2007/0153051 A1 | 7/2007 | Lee | |
| 2007/0222817 A1 | 9/2007 | Kurita et al. | |
| 2012/0178190 A1* | 7/2012 | Krijne et al. | .................... 438/22 |

FOREIGN PATENT DOCUMENTS

| | | |
|---|---|---|
| KR | 10-2005-0060438 A | 6/2005 |
| KR | 10-2006-0114835 A | 11/2006 |
| KR | 10-2007-0025326 A | 3/2007 |
| KR | 10-2007-0073392 A | 7/2007 |
| KR | 10-0906171 B1 | 7/2009 |

* cited by examiner

*Primary Examiner* — Dah-Wei D Yuan
*Assistant Examiner* — Jethro M Pence
(74) *Attorney, Agent, or Firm* — Knobbe Martens Olson & Bear LLP

(57) ABSTRACT

An organic light-emitting layer forming apparatus includes a stage supporting an intermediate product of an organic light emitting device, which includes a substrate, and a pixel defining layer including first openings. The apparatus includes a first mask disposed over the stage and including second openings, and a second mask disposed over the first mask and including third openings. The second mask is movable relative to the first mask between first and second positions. The third openings do not overlap the second openings in the first position while overlapping the second openings in the second position. The apparatus includes an inkjet head unit disposed over the second mask and supplying an organic material to the third openings of the second mask in the first position. The second mask moves to the second position to transfer the organic material through the second openings.

8 Claims, 6 Drawing Sheets

APPARATUS FOR FORMING ORGANIC LIGHT EMITTING LAYER AND METHOD OF FORMING ORGANIC LIGHT EMITTING LAYER USING THE SAME

CROSS-REFERENCE TO RELATED APPLICATION

This U.S. non-provisional patent application claims priority under 35 U.S.C. §119 of Korean Patent Application No. 10-2013-0042373, filed on Apr. 17, 2013, the contents of which are hereby incorporated by reference in its entirety.

BACKGROUND

1. Field of Disclosure

The present disclosure relates to an apparatus for forming an organic light emitting layer and a method of forming the organic light emitting layer using the foregoing apparatus.

2. Discussion of the Related Technology

In recent years, an organic light emitting diode display has been spotlighted as a next generation display device since it has superior brightness and viewing angle and does not need to include a separate light source when compared to a liquid crystal display. Therefore, the organic light emitting diode display has thin thickness and light weight. In addition, the organic light emitting diode display has properties, e.g., fast response speed, low power consumption, high brightness, etc.

The organic light emitting diode display includes an organic light emitting device that includes an anode electrode, an organic light emitting layer, and a cathode electrode. Holes and electrons injected into the organic light emitting layer are recombined in the organic light emitting layer to generate excitons. The excitons emit energy, which is discharged when an excited state returns to a ground state to emit light.

SUMMARY

One aspect of the invention provides an apparatus capable of forming an organic light emitting layer with a uniform thickness.

Another aspect of the invention provides a method of forming the organic light emitting layer using the foregoing apparatus.

Embodiments of the inventive concept provide an apparatus for forming an organic light emitting layer in an intermediate product of an organic light emitting device. The apparatus includes a stage configured to support an intermediate product of an organic light emitting device, wherein the intermediate product comprises a substrate, and a pixel defining layer disposed over the substrate and including a plurality of first openings to define a plurality of pixel areas, a first mask disposed over the stage and including a plurality of second openings, a second mask disposed over the first mask and including a plurality of third openings, the second mask being movable relative to the first mask between a first position and a second position, wherein the third openings do not overlap the second openings when the second mask is in the first position and the third openings overlap the second openings when the second mask is in the second position, and an inkjet head unit disposed over the second mask and configured to substantially simultaneously supply an organic material to the third openings when the second mask is in the first position. The second mask is configured to move to the second position to transfer the organic material through the second openings.

The apparatus further includes an electromagnetic unit configured to generate a magnetic force in response to a source voltage applied thereto.

The apparatus is configured to hold the intermediate product between the stage and the first mask, configured to make the first mask in contact with the pixel defining layer by the magnetic force of the electromagnetic unit, and further configured to make the second mask in contact with the first mask by the magnetic force of the electromagnetic unit.

The intermediate product further includes a plurality of first electrodes disposed over the substrate to correspond to the pixel areas. The pixel defining layer covers peripheral portions of the first electrodes and central portions of the first electrodes are exposed through the first openings.

The organic material supplied to the third openings is provided on the first electrodes in the first openings through the second openings.

The inkjet head unit includes a plurality of nozzles arranged to correspond to the third openings and the organic material is substantially simultaneously supplied to the third openings through the nozzles.

Each second opening has a size substantially the same as that of each third opening, and the first and second masks include at least one selected from the group consisting of Co, Fe, Ni, Pt, Pd, and a rare earth metal.

Embodiments of the inventive concept provide a method of forming an organic light emitting layer. The method includes providing an intermediate product of an organic light emitting device, which comprises a substrate and a pixel defining layer, the pixel defining layer including a plurality of first openings to define the pixel area, disposing a first mask including a plurality of second openings over the pixel defining layer, wherein the plurality of second openings are arranged to overlap with the first openings of the pixel defining layer, disposing a second mask including a plurality of third openings over the first mask, wherein the plurality of third openings are arranged not to overlap with the second openings of the first mask, disposing an inkjet head unit over the second mask, substantially simultaneously supplying an organic material to the third openings using the inkjet head unit, and moving the second mask relative to the first mask to overlap the third openings with the second openings, thereby transferring the supplied organic material through the second openings. The pixel defining layer is formed to cover peripheral portions of the first electrodes and the first openings of the pixel defining layer expose central portions of the first electrodes.

The method further includes providing an electromagnetic unit under the substrate and generating a magnetic force in response to a source voltage applied thereto.

The first mask makes contact with the pixel defining layer by the magnetic force of the electromagnetic unit and the second mask makes contact with the first mask by the magnetic force of the electromagnetic unit.

When the third openings overlap the second openings, the organic material supplied to the third openings is transferred to the first openings through the second openings.

The inkjet head unit includes a plurality of nozzles arranged to correspond to the third openings and the organic material is substantially simultaneously supplied to the third openings through the nozzles.

According to the above, the organic light emitting layer may have a uniform thickness.

Embodiments of the invention provide an apparatus for applying an organic light emissive material. The apparatus comprises: a stage configured to support a substrate subject to application of an organic light emissive material; an inkjet head placed over the stage and comprising an array of nozzles, each of which is configured to eject an amount of the organic light emissive material; a first mask disposed between the stage and the inkjet head and comprising an array of first holes; and a second mask disposed between the first mask and the inkjet head and comprising an array of second holes, each of which corresponds to one of the nozzles and one of the first holes; wherein the second mask is movable relative to the first mask between a first position in which the second holes do not overlap the first holes and a second position in which the second holes overlap the first holes, wherein the inkjet head is configured to eject the organic light emissive material to each of second holes of the second mask in the first position, wherein the second mask is configured to move to the second position such that the organic light emissive material in the second holes is transferred through the first holes and applied over the substrate.

The foregoing apparatus may further comprise an electromagnetic device configured to apply magnetic force to the second mask to pull the second mask toward the stage such that the substrate is held between the first mask and the stage. In the foregoing apparatus, each second hole has a size substantially the same as that of each first hole. The inkjet head may be configured to substantially simultaneously eject the organic light emissive material through the nozzles.

Embodiments of the invention provide a method of making an organic light emitting device. The method comprises: providing the foregoing apparatus; placing a substrate between the stage and the first mask; ejecting an organic light emissive material through the nozzles of the inkjet head into the second holes of the second mask placed in the first position; and moving the second mask relative to the first mask to the second position to transfer the organic light emissive material retained in the second holes over the substrate through the first holes of the first mask, thereby applying the organic light emissive material over the substrate.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Hereinafter, the present invention will be explained in detail with reference to the accompanying drawings.

Figure 1:
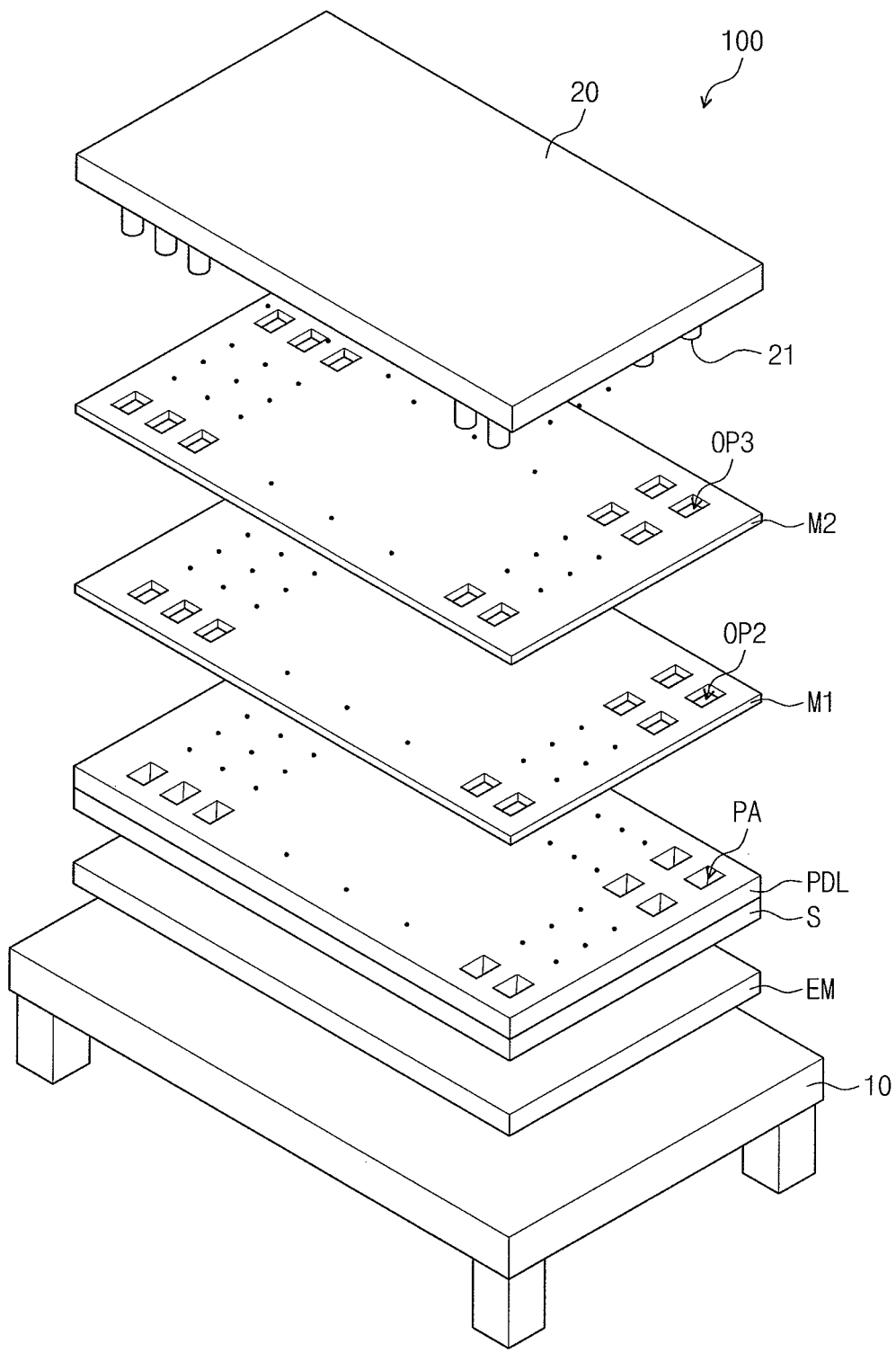
FIG. 1 is an exploded perspective view showing an apparatus for forming an organic light emitting layer according to an exemplary embodiment of the present disclosure.
Figure 2:
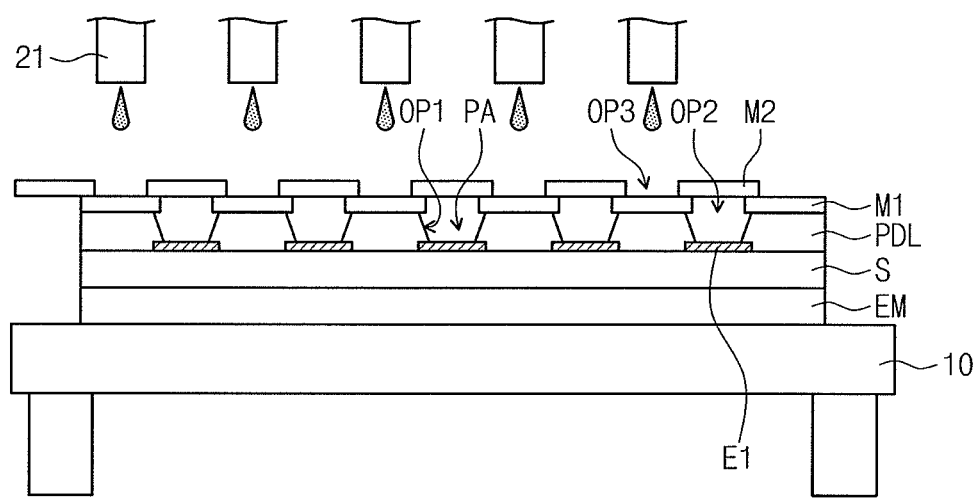
FIG. 2 is a cross-sectional view showing the apparatus for forming the organic light emitting layer shown in FIG. 1.

FIG. 1 is an exploded perspective view showing an apparatus for forming an organic light emitting layer according to an exemplary embodiment of the present disclosure and FIG. 2 is a cross-sectional view showing the apparatus for forming the organic light emitting layer shown in FIG. 1.

Referring to FIGS. 1 and 2, the apparatus 100 (hereinafter, referred to as organic light-emitting layer forming apparatus) for forming the organic light emitting layer includes a stage 10, an electromagnetic unit EM, a substrate S, a first mask M1, a second mask M2, and an inkjet head unit 20.

The electromagnetic, unit EM is disposed on the stage 10. When a source voltage is applied to the electromagnetic unit EM, the electromagnetic unit EM generates a magnetic force.

The substrate S is disposed on the electromagnetic unit EM. The substrate includes a plurality of pixel areas PA arranged in a matrix form. For the convenience of explanation, five pixel areas PA have been shown in FIG. 2, but the number of the pixel areas PA should not be limited to five.

A plurality of first electrodes E1 is arranged on the substrate S. The first electrodes E1 are arranged to correspond to the pixel areas PA, respectively. A pixel defining layer PDL is disposed on the substrate S to cover a peripheral portion of each of the first electrodes E1. The pixel defining layer PDL includes a plurality of first openings OP1 formed therethrough to define the pixel areas PA. That is, areas in which the first openings OP1 are formed may be the pixel areas PA. Accordingly, the pixel areas PA are partitioned by the pixel defining layer PDL. Each of the first openings OP1 of the pixel defining layer PDL exposes a central portion of a corresponding first electrode of the first electrodes E1.

The first mask M1 is disposed on the pixel defining layer PDL. The first mask M1 includes a plurality of second openings or holes OP2 formed therethrough to correspond to the pixel areas PA, respectively. The second openings OP2 are disposed to overlap with the first openings OP1, respectively. The first mask M1 may be formed of a magnetic material, e.g., Co, Fe, Ni, Pt, Pd, or a rare earth metal.

As described above, when the source voltage is applied to the electromagnetic unit EM, the electromagnetic unit EM generates the magnetic force. Since the first mask M1 includes the magnetic material, an attractive force is applied between the electromagnetic unit EM and the first mask M1 by the magnetic force of the electromagnetic unit EM while the source voltage is applied to the electromagnetic unit EM. As a result, the first mask M1 is pulled down in a direction in which the electromagnetic unit EM is disposed, and the first mask M1 makes contact with the pixel defining layer PDL such that the substrate is firmly held between the stage and the first mask M1.

The second mask M2 is disposed on the first mask M1. The second mask M2 includes a plurality of third openings or holes OP3 corresponding to the pixel areas PA, respectively. The third openings OP3 of the second mask M2 are disposed not to be overlapped with the second openings OP2 of the first mask M1. Each second opening OP2 has a size substantially the same as that of each third opening OP3. The second mask M2 may be formed of a magnetic material, such as Co, Fe, Ni, Pt, Pd, or a rare earth metal.

In embodiments, since the second mask M2 includes the magnetic material, the attractive force acts between the electromagnetic unit EM and the second mask M2 by the magnetic force of the electromagnetic unit EM while the source voltage is applied to the electromagnetic unit EM. As a result, the second mask M2 is pulled down in the direction in which the electromagnetic unit EM is disposed, and the second mask M2 makes contact with the first mask M1.

The inkjet head unit 20 is disposed over the second mask M2. The inkjet head unit 20 supplies an organic material which is used to form an organic light emitting layer to the third openings OP3 of the second mask M2. The inkjet head unit 20 includes a plurality of nozzles 21 respectively corresponding to the third openings OP3 of the second mask M2. Each of the nozzles 21 is disposed at a position corresponding to a corresponding third opening of the third openings OP3. The organic material is substantially simultaneously supplied to the third openings OP3 of the second mask M2 through the nozzles 21 of the inkjet head unit 20. In embodiments, when the second mask is in a first position, the inkjet head 20 ejects the organic material. In the first position, each nozzle and the corresponding one of the third openings are aligned in an organic material ejecting direction such that the organic material from each nozzle can be ejected to the corresponding second opening.

Further, in the first position, the second openings OP2 of the first mask M1 do not overlap with the third openings OP3 of the second mask M2 when viewed in a plan view, i.e., when viewed in a direction perpendicular to a major surface of the substrate, and the first mask M1 makes contact with the second mask M2 and blocks the third openings. Thus, the organic material supplied to the third openings OP3 is retained in the third openings OP3.

Although not shown in figures, the second mask M2 supplied with the organic material moves to a second position to allow the second openings OP2 of the first mask M1 to overlap with the third openings OP3 of the second mask M2. Therefore, the organic material retained in the third openings OP3 is supplied to the pixel areas PA through the second openings OP2. That is, the organic material retained in the third openings OP3 is substantially simultaneously supplied to the first openings OP1, which define the pixel areas PA, via the second openings OP2. Accordingly, the organic material may be supplied to the first openings OP1 in a substantially uniform amount.

The organic material supplied to the first openings OP1 is provided on the first electrodes E1 in the first openings OP1. When the organic material is cured, organic light emitting layers are formed. The method of forming the organic light emitting layer will be described in detail later. Since the organic material is provided in uniform amount to the first openings OP1 that define the pixel areas PA, the organic light emitting layers may be formed in the first openings OP1 at a uniform thickness.

Consequently, the organic light-emitting layer forming apparatus 100 according to the present exemplary embodiment may form the organic light emitting layers each having a uniform thickness.

FIGS. 3A to 3F are views showing the method of forming the organic light emitting layer using the organic light-emitting layer forming apparatus shown in FIG. 1.

Figure 3A:
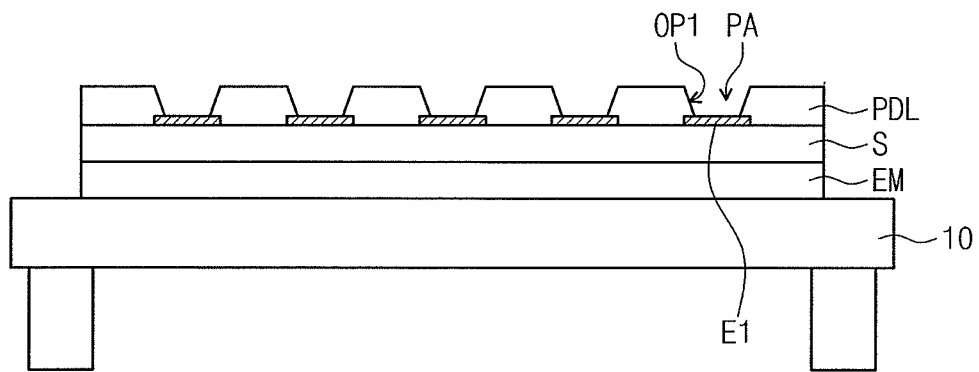
FIGS. 3A to 3F are views showing a method of forming the organic light emitting layer using the apparatus shown in FIG. 1.

Referring to FIG. 3A, the substrate S, on which the pixel defining layer PDL including the first openings OP1 that define the pixel area PA is disposed, is prepared. The electromagnetic unit EM that generates the magnetic force in response to the source voltage applied thereto is disposed under the substrate S. The first electrodes E1 are formed on the substrate S and the pixel defining layer PDL is formed to cover the peripheral portion of each of the first electrodes E1.

Figure 3B:
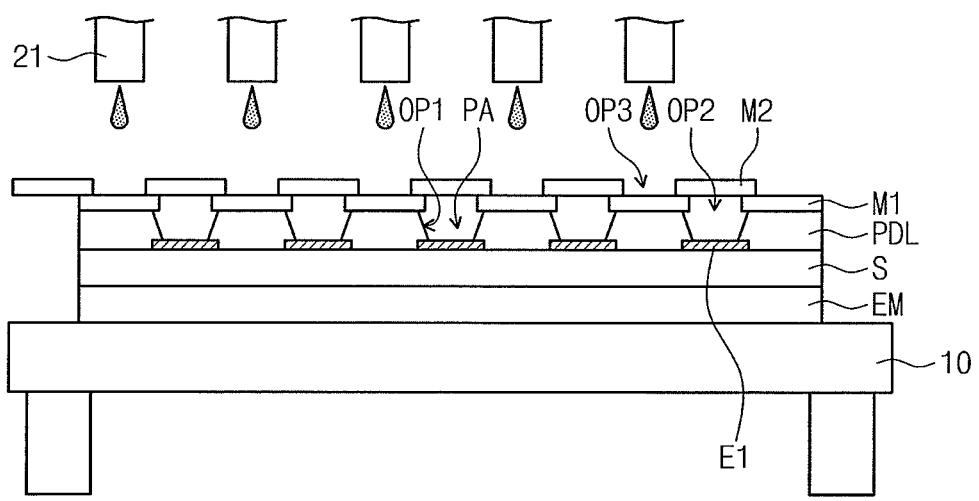

Referring to FIG. 3B, the first mask M1 is disposed on the pixel defining layer PDL. The second openings OP2 of the first mask M1 are disposed to overlap with the first openings OP1, respectively. The second mask M2 is disposed on the first mask M1. The third openings OP3 of the second mask M2 are disposed not to be overlapped with the second openings OP2 of the first mask M1.

In embodiments, the first and second masks M1 and M2 are formed of the magnetic material. Thus, when the source voltage is applied to the electromagnetic unit EM, the attractive force is applied between the electromagnetic unit EM and the first mask M1 and between the electromagnetic unit EM and the second mask M2, which is caused by the magnetic force of the electromagnetic unit EM. As a result, the first mask M1 makes contact with the pixel defining layer PDL and the second mask M2 makes contact with the first mask M1.

Figure 3C:
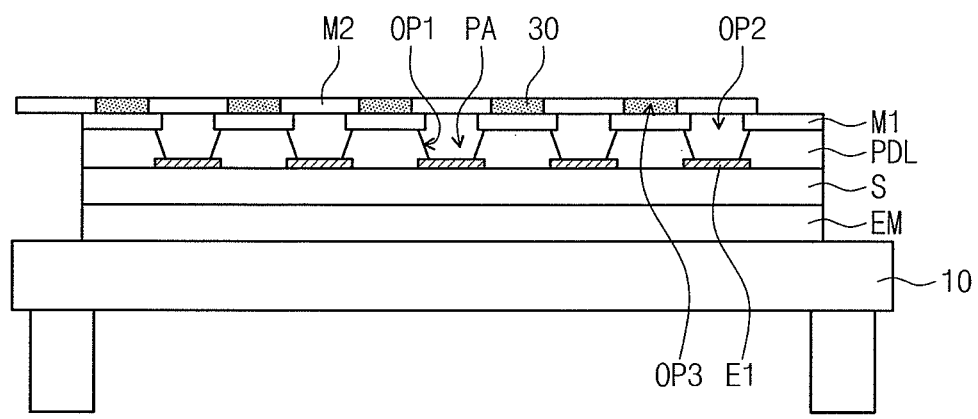

Referring to FIG. 3C, the inkjet head unit 20 is disposed over the second mask M2. The nozzles 21 of the inkjet head unit 20 are disposed to correspond to the openings OP3. The organic material 30 is substantially simultaneously supplied to the third openings OP3 through the nozzles 21 of the inkjet head unit 20.

The second openings OP2 of the first mask M1 are not overlapped with the third openings OP3 of the second mask M2 when viewed in a plan view, and the first mask M1 makes contact with the second mask M2. Thus, the organic material 30 supplied to the third openings OP3 is retained in the third openings OP3.

Figure 3D:
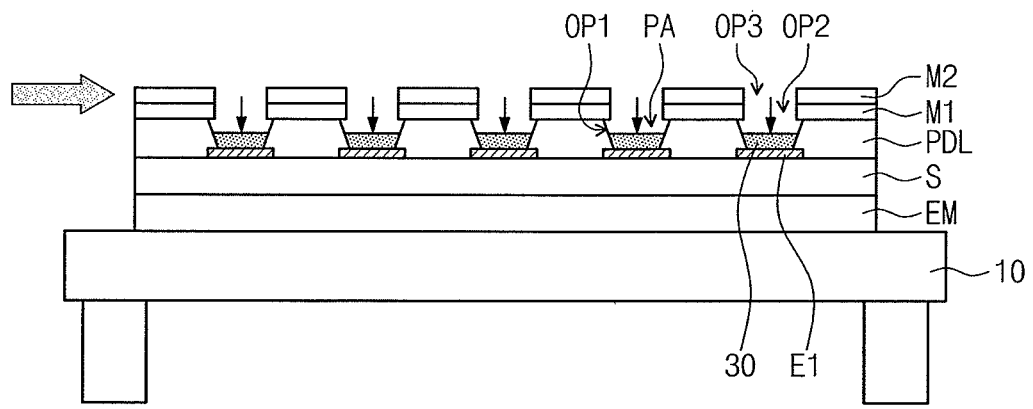

Referring to FIG. 3D, the second mask M2 supplied with the organic material 30 moves relative to the first mask to allow the second openings OP2 of the first mask M1 to overlap with the third openings OP3 of the second mask M2. Although not shown in figures, a moving device is connected to the second mask M2 to move the second mask M2.

The organic material 30 retained in the third openings OP3 is substantially simultaneously supplied to the first openings OP1, which define the pixel areas PA, through the second openings OP2. As a result, the organic material 30 may be supplied to the first openings OP1 in a substantially uniform amount. The organic material 30 supplied to the first openings OP1 is provided on the first electrodes E1 in the first openings OP1.

Figure 3E:
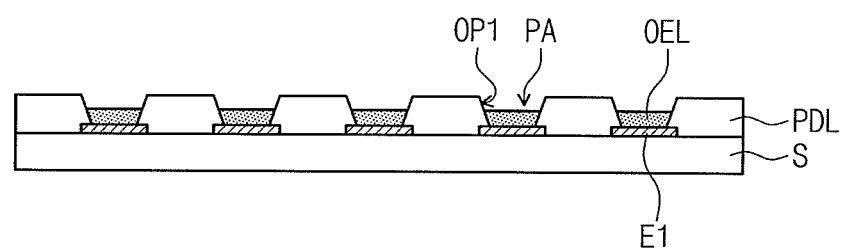

Referring to FIG. 3E, the organic material 30 supplied to the first openings OP1 is cured to form the organic light emitting layers OEL. Since the organic material 30 is provided in a substantially uniform amount to the first openings OP1 that define the pixel areas PA, the organic light emitting layers OEL may be formed in the first openings OP1 at a uniform thickness.

Figure 3F:
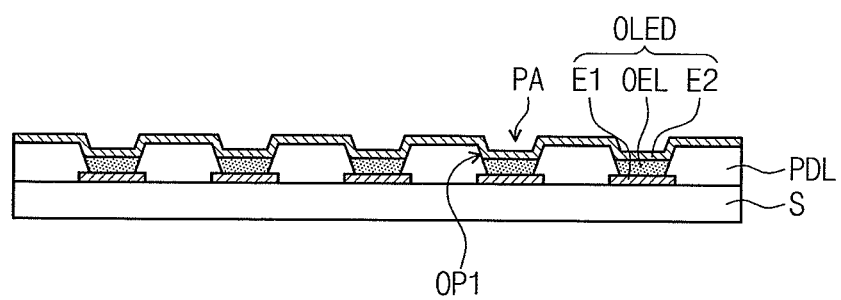

FIG. 3F shows a second electrode E2 formed on the organic light emitting layers OEL and the pixel defining layer PDL after the organic light emitting layers OEL are formed. Organic light emitting devices OLED are formed in the pixel areas PA. Each of the organic light emitting device OLED includes the first electrode E1, the organic light emitting layer OEL, and the second electrode E2.

In a case that the first and second masks M1 and M2 are not used, an inkjet head unit with one nozzle or an inkjet head unit with nozzles arranged in one row or column may be used. In this case, the inkjet head unit moves to a predetermined direction and supplies the organic material in a predetermined amount to the first openings OP1. Although the organic material in the predetermined amount is supplied, the organic material in a small amount may be attached to the nozzle of the inkjet head unit while the inkjet head unit moves. Due to an air flow generated by the movement of the inkjet head unit, the organic material attached to the nozzle of the inkjet head unit may be provided to the first openings OP1 in a particle state.

The organic material in the particle state serves as a foreign substance. The foreign substance may be provided on the organic material received in the first openings OP1. In this case, the thickness of the organic light emitting layers formed in the first openings OP1 may be non-uniform. When the thickness of the organic light emitting layers becomes non-uniform, brightness becomes non-uniform in the pixel areas PA.

The organic light-emitting layer forming apparatus 100 according to the present exemplary embodiment of the present disclosure may fill the third openings OP3 of the second mask M2 with the organic material 30 through the nozzles 21 of the inkjet head unit 20. Therefore, the inkjet head unit 20 is not required to move, and thus the foreign substance may be prevented from being generated.

Since the second openings OP2 are overlapped with the third openings OP3 retaining the organic material 30, the organic material 30 is substantially simultaneously supplied to the first openings OP1 that define the pixel areas PA. Thus, the organic material 30 in the uniform amount is substantially simultaneously supplied to the first openings OP1 that define the pixel area PA. As a result, the organic light emitting layers OEL may be formed in the first openings OP1 at a uniform thickness.

Consequently, the organic light-emitting layer forming apparatus 100 according to the present exemplary embodiment may form the organic light emitting layers each having a uniform thickness.

Figure 4:
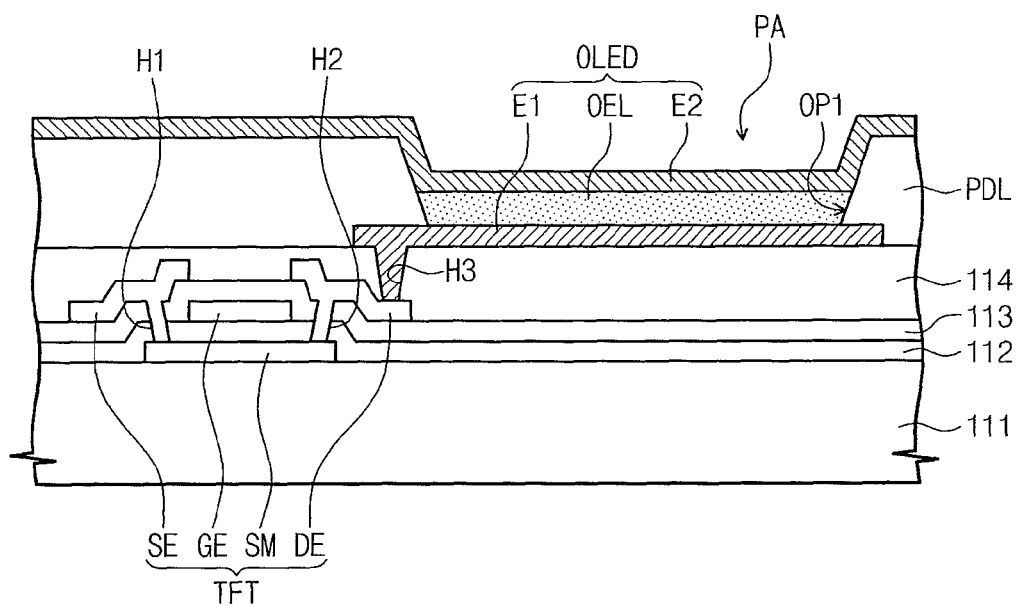
FIG. 4 is a cross-sectional view showing an organic light emitting device including the organic light emitting layer formed by the apparatus shown in FIG. 1.

FIG. 4 is a cross-sectional view showing an organic light emitting device including the organic light emitting layer formed by the organic light-emitting layer forming apparatus shown in FIG. 1.

Referring to FIG. 4, the substrate S includes a base substrate 111, a first insulating layer 112, a second insulating layer 113, a protective layer 114, and thin film transistors TFT each being connected to a corresponding organic light emitting device of the organic light emitting devices OLED. The thin film transistors TFT are connected to the organic light emitting devices OLED, respectively, to drive the organic light emitting devices OLED.

In embodiments, the thin film transistors TFT have the same structure throughout the organic light emitting device, and thus hereinafter, one thin film transistor TFT will be described in detail. In addition, since the organic light emitting devices OLED have the same structure, one organic light emitting device OLED will be described in detail.

The base substrate 111 is a transparent insulating substrate formed of glass, quartz, or ceramic or a transparent flexible substrate formed of plastic. In addition, the base substrate 111 may be a metal substrate formed of a stainless steel.

A semiconductor layer SM of the thin film transistor TFT is disposed over the base substrate 111. The semiconductor layer SM may be formed of an inorganic semiconductor material, such as amorphous silicon or polysilicon, or an organic semiconductor material. In addition, the semiconductor layer SM may be formed of oxide semiconductor. Although not shown in FIG. 4, the semiconductor layer MS includes a source region, a drain region, and a channel region disposed between the source region and the drain region.

A first insulating layer 112 is formed to cover the semiconductor layer SM. The first insulating layer 112 serves as a gate insulating layer.

A gate electrode GE of the thin film transistor TFT is formed on the first insulating layer 112 to overlap with the semiconductor layer SM. In detail, the gate electrode GE is formed to be overlapped with the channel region of the semiconductor layer SM. The gate electrode GE is connected to a gate line (not shown) through which an on/off signal is applied to the thin film transistor TFT.

A second insulating layer 113 is formed to cover the gate electrode GE. The second insulating layer 113 serves as an inter-insulating layer.

A source electrode SE and a drain electrode DE of the thin film transistor TFT are formed on the second insulating layer 113 to be spaced apart from each other. The source electrode SE is connected to the semiconductor layer SM through a first contact hole H1 formed penetrating through the first insulating layer 112 and the second insulating layer 113. In detail, the source electrode SE is connected to the source region of the semiconductor layer SM. The drain electrode DE is connected to the semiconductor layer SM through a second contact hole H2 formed penetrating through the first insulating layer 112 and the second insulating layer 113. In detail, the drain electrode DE is connected to the drain region of the semiconductor layer SM.

A protective layer 114 is formed to cover the source electrode SE and the drain electrode DE of the thin film transistor TFT. The first electrodes E1 of the organic light emitting devices OLED are formed on the protective layer 114. The first electrodes E1 are connected to the drain electrodes of the thin film transistors TFT through contact holes H3 formed penetrating through the protective layer 114.

The first electrode E1 is formed on the protective layer 114. The first electrode E1 may serve as a pixel electrode or an anode electrode. The first electrode E1 may be a transmission type electrode or a reflection type electrode. When the first electrode E1 is the transmission type electrode, the first electrode E1 may include indium tin oxide (ITO), indium zinc oxide (IZO), or zinc oxide (ZnO). When the first electrode E1 is the reflection type electrode, the first electrode E1 may include a reflection layer formed of Ag, Mg, Al, Pt, Pd, Au, Ni, Nd, Ir, Cr, or a compound thereof and a transparent conductive layer formed of ITO, IZO, or ZnO.

The organic light emitting layer OEL is formed on the first electrode E1 in the first opening OP1. The organic light emitting layer OEL includes an organic material that generates a light with a red color, a green color, or a blue color. Accordingly, the organic light emitting layer OEL generates a red light, a green light, or a blue light, but it should not be limited thereto or thereby. That is, the organic light emitting layer OEL may generate a white light obtained by combining organic materials generating the red, green, and blue lights.

The organic light emitting layer OEL may be formed of a low molecular organic material or a high molecular organic material. Although not shown in FIG. 4, the organic light emitting layer OEL has a multi-layer structure of a hole injection layer, a hole transporting layer, an emission layer, an electron transporting layer, and an electron injection layer. As an example, the hole injection layer is disposed on the first electrode E1, and the hole transporting layer, the emission layer, the electron transporting layer, and the electron injection layer are sequentially stacked on the hole injection layer.

The second electrode E2 is formed on the pixel defining layer PDL and the organic light emitting layers OEL. The second electrode E2 may serve as a common electrode or a cathode electrode.

The second electrode E2 may be a transmission type electrode or a reflection type electrode. When the second electrode E2 is the transmission type electrode, the second electrode E2 includes a layer formed by depositing Li, Ca, LiF/Ca, LiF/Al, Al, Mg, or a compound thereof and an auxiliary electrode formed on the layer using a transparent conductive material, e.g., ITO, IZO, or ZnO. When the second electrode E2 is the reflection type electrode, the second electrode E2 is formed of Ag, Mg, Al, Pt, Pd, Au, Ni, Nd, Ir, Cr, Li, Ca, LiF/Ca, LiF/Al, or a compound thereof.

When an organic light emitting diode display is a front surface light emitting type, the reflection type electrode is used as the first electrode E1 and the transmission type electrode is used as the second electrode E2. When the organic light emitting diode display is a rear surface light emitting type, the first electrode E1 is the transmission type electrode and the second electrode E2 is the reflection type electrode.

The organic light emitting device OLED is formed by the first electrode E1, the organic light emitting layer OEL, and the second electrode E2 in the pixel area PA. That is, the organic light emitting device OLED is formed in the pixel area PA and includes the first electrode E1, the organic light emitting layer OEL, and the second electrode E2 in the pixel area PA.

The first electrode E1 may be a hole injection electrode, i.e., a positive electrode, and the second electrode E2 may be an electron injection electrode, i.e., a negative electrode, but they should not be limited thereto or thereby. That is, the first electrode E1 may be the negative electrode and the second electrode E2 may be the positive electrode according to the driving method of the organic light emitting diode display.

A driving voltage is applied to the first electrode E1 and a voltage having an opposite polarity to that of the driving voltage is applied to the second electrode E2 by the thin film transistors TFT, and thus the organic light emitting layer OEL emits the light. In this case, holes and electrons injected into the organic light emitting layer are recombined in the organic light emitting layer to generate excitons, and the organic light emitting device OLED emits the light by the excitons that return to a ground state from an excited state. Accordingly, the organic light emitting device OLED emits the red light, the green light, and the blue light according to a current flow, thereby displaying predetermined image information.

The organic light emitting layers OEL formed by the organic light-emitting layer forming apparatus 100 may have the uniform thickness. Thus, the organic light emitting device OLED may include the organic light emitting layers OEL with the uniform thickness.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic light emitting layer forming apparatus comprising:
    a stage configured to support an intermediate product of an organic light emitting device, wherein the intermediate product comprises a substrate, a pixel defining layer disposed over the substrate, and a plurality of recesses formed into the pixel defining layer;
    a first mask disposed over the stage and comprising a first array of openings, each opening of the first array individually corresponding to one of the plurality of recesses;
    a second mask disposed over the first mask and comprising a second array of openings, the second mask configured to slide relative to the first mask between a first position and a second position such that, at the first position, the openings of the second array do not overlap with their individually corresponding openings of the first array and at the second position, the openings of the second array overlap with, their individually corresponding openings of the first array; and
    an array of inkjet heads disposed over the second mask and configured to drop the liquid material towards the second array of the second mask.

2. The apparatus of claim 1, further comprising an electromagnetic unit configured to generate a magnetic force in response to a source voltage applied thereto.

3. The apparatus of claim 2, wherein the apparatus is configured to hold the intermediate product between the stage and the first mask, configured to make the first mask in contact with the pixel defining layer, and further configured to make the second mask in contact with the first mask by the magnetic force of the electromagnetic unit.

4. The apparatus of claim 3, wherein the intermediate product further comprises a plurality of first electrodes disposed over the substrate to correspond to the pixel areas, wherein the pixel defining layer covers peripheral portions of the first electrodes and central portions of the first electrodes are exposed through the recesses.

5. The apparatus of claim 4, wherein the organic material supplied to the second array of openings is provided on the first electrodes through the first array of openings.

6. The apparatus of claim 1, wherein the inkjet head unit comprises a plurality of nozzles arranged to correspond to the second array of openings such that the organic material is simultaneously supplied to the second array of openings. through the nozzles.

7. The apparatus of claim 1, wherein each opening of the first array has the same size as that of corresponding opening of the second array.

8. The apparatus of claim 1, wherein the first and second masks comprise at least one selected from the group consisting of Co, Fe, Ni, Pt, Pd, and a rare earth metal.

* * * * *